United States Patent
Kim et al.

(10) Patent No.: US 11,582,878 B2
(45) Date of Patent: Feb. 14, 2023

(54) VISUAL DISPLAY STAND

(71) Applicant: Vizio, Inc., Irvine, CA (US)

(72) Inventors: Glen Gihong Kim, Anaheim, CA (US); Aung Khin Soe Win, Alhambra, CA (US); William Wei Wang, Irvine, CA (US)

(73) Assignee: Vizio, Inc., Irvine, CA (US)

( * ) Notice: Subject to any disclaimer, the term of this patent is extended or adjusted under 35 U.S.C. 154(b) by 35 days.

(21) Appl. No.: 17/071,120

(22) Filed: Oct. 15, 2020

(65) Prior Publication Data

US 2021/0120689 A1   Apr. 22, 2021

Related U.S. Application Data

(60) Provisional application No. 62/915,727, filed on Oct. 16, 2019.

(51) Int. Cl.
*H05K 5/02* (2006.01)

(52) U.S. Cl.
CPC .................................. *H05K 5/0234* (2013.01)

(58) Field of Classification Search
None
See application file for complete search history.

(56) References Cited

U.S. PATENT DOCUMENTS

| | | | |
|---|---|---|---|
| 6,268,998 B1 | 7/2001 | Cho | |
| 7,967,273 B2 | 6/2011 | Zhou et al. | |
| 8,174,823 B2 | 5/2012 | Green | |
| 9,161,696 B2 | 10/2015 | Al-Ali et al. | |
| 2007/0181755 A1 | 8/2007 | Oh et al. | |
| 2007/0181772 A1 | 8/2007 | O'Neill | |
| 2012/0120628 A1 | 5/2012 | Bliven et al. | |
| 2012/0218702 A1 | 8/2012 | Green | |
| 2014/0153182 A1 | 6/2014 | North et al. | |

(Continued)

FOREIGN PATENT DOCUMENTS

| | | | |
|---|---|---|---|
| CN | 205427709 | | 8/2016 |
| CN | 106195567 A | * | 12/2016 |

(Continued)

OTHER PUBLICATIONS

English translation of CN208128424 from Lexis Nexis Total Patent.

(Continued)

*Primary Examiner* — James Wu
*Assistant Examiner* — Christopher L Augustin
(74) *Attorney, Agent, or Firm* — Hansen IP Law PLLC

(57) ABSTRACT

A visual display stand is shown and described. The display stand comprises a thin aluminum member that slopes downward and away from a display to which it is attached to a horizontal base section that rests on a support surface. The horizontal base is spaced apart from the screen in a direction away from the rear of the display. A rear support member is also provided but is concealed from view when looking at the screen side of the display. As a result, when the stand is attached to display and viewed from the front, it gives a gravity defying appearance because it appears that the weight of the monitor should cause the stand to tip over. Alternatively, the second member may be removed, and the display may rest against a wall.

36 Claims, 11 Drawing Sheets

(56) References Cited

U.S. PATENT DOCUMENTS

| | | | | |
|---|---|---|---|---|
| 2014/0239142 A1* | 8/2014 | Frenzel | ............ | F16M 11/38 |
| | | | | 248/451 |
| 2014/0270910 A1* | 9/2014 | Sculler | ............ | H04N 5/64 |
| | | | | 403/109.1 |
| 2014/0294215 A1* | 10/2014 | Caldes | ............ | H04R 1/028 |
| | | | | 381/333 |
| 2015/0022966 A1* | 1/2015 | Chen | ............ | H01R 25/006 |
| | | | | 361/679.41 |
| 2015/0195923 A1 | 7/2015 | Yusef | | |
| 2016/0050785 A1* | 2/2016 | Hsieh | ............ | F16M 11/16 |
| | | | | 361/679.01 |
| 2016/0143160 A1* | 5/2016 | Huang | ............ | H04N 5/642 |
| | | | | 361/728 |
| 2016/0239045 A1* | 8/2016 | Tseng | ............ | G06F 1/1601 |
| 2018/0110145 A1* | 4/2018 | Choi | ............ | H05K 5/0234 |

FOREIGN PATENT DOCUMENTS

| | | | | |
|---|---|---|---|---|
| CN | 208128424 | | 11/2018 | |
| DE | 60308666 | | 8/2007 | |
| EP | 1980784 B1 | | 3/2011 | |
| JP | 6320650 B2 | | 5/2018 | |
| KR | 200486825 Y1 * | | 7/2018 | ............ H04R 1/026 |
| WO | 20170199744 | | 11/2017 | |

OTHER PUBLICATIONS

English translation of JP6320650 from Google Patents.
English translation of DE60308666 from Google Patents.
English translation of WO20170199744 from Google Patents.
English translation of CN205427709 from Google Patents.

* cited by examiner

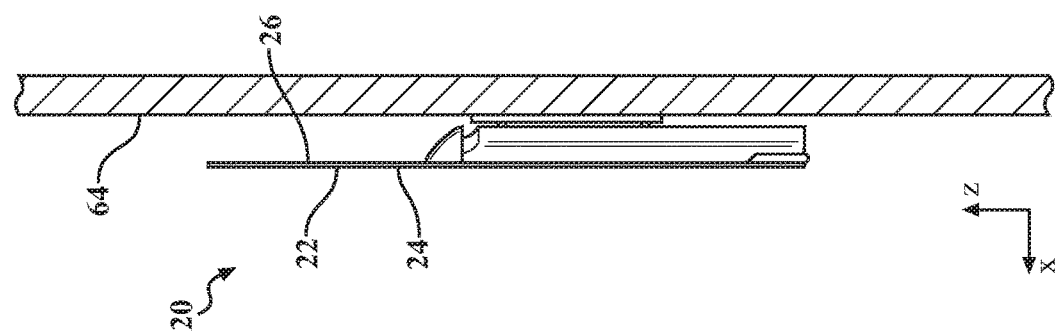
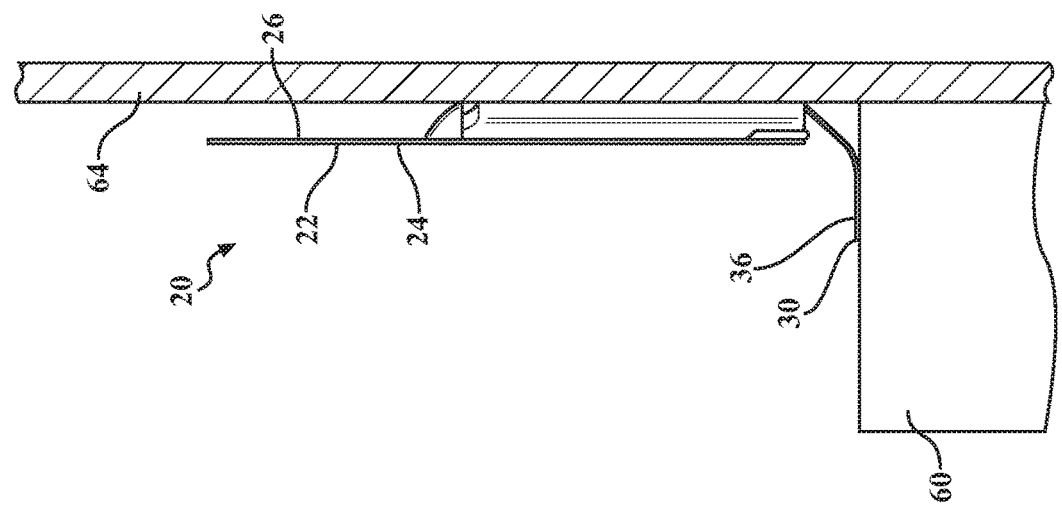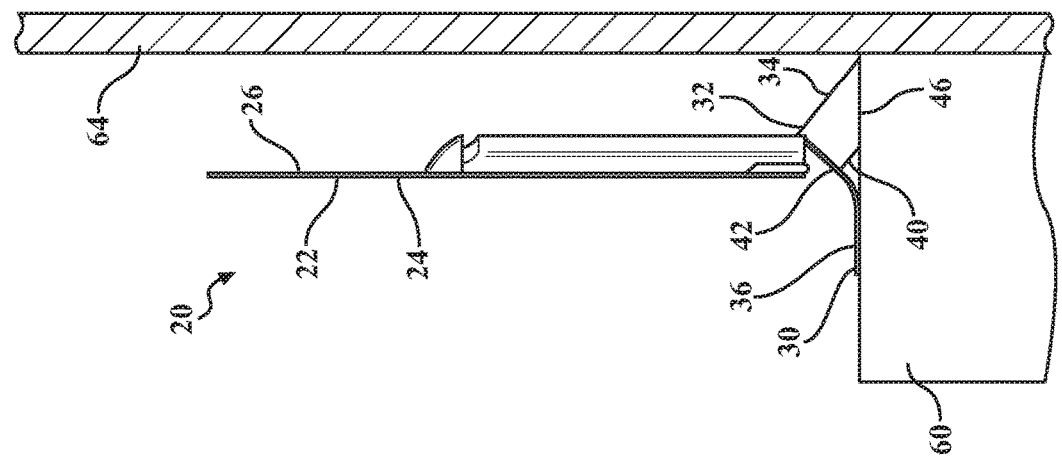

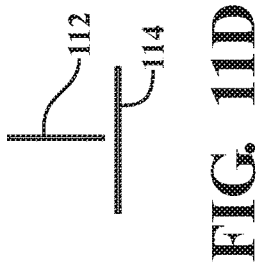
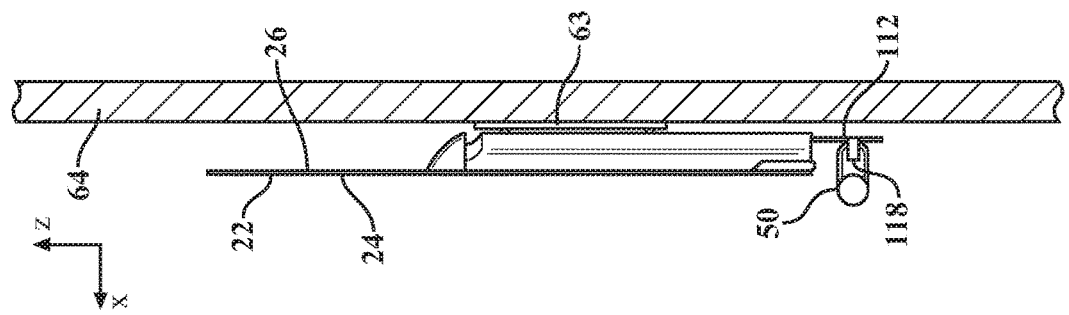
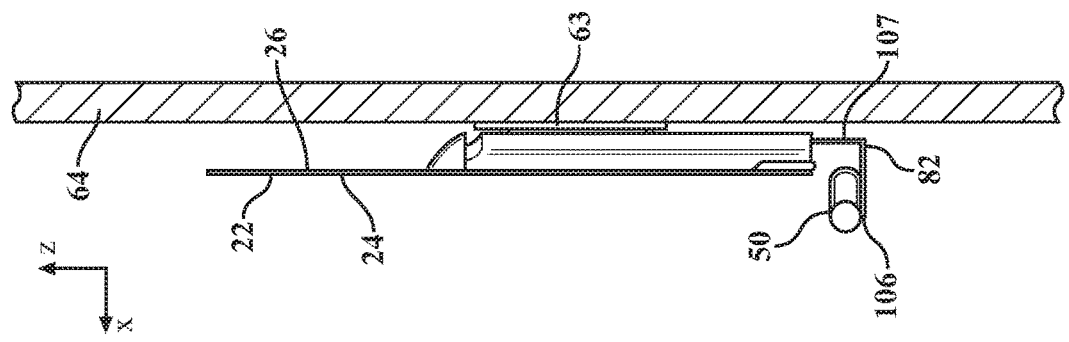
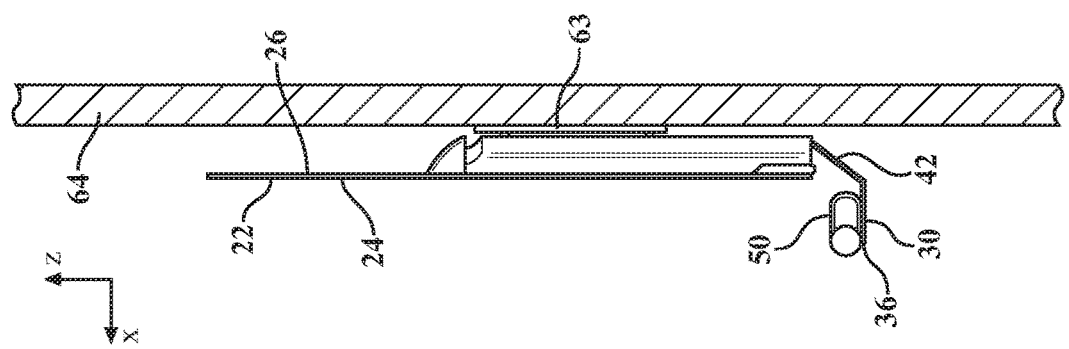

VISUAL DISPLAY STAND

CROSS-REFERENCE TO RELATED APPLICATIONS

This application claims the benefit of U.S. Provisional Application No. 62/915,727, filed Oct. 16, 2019, the entirety of which is hereby incorporated by reference.

TECHNICAL FIELD

This disclosure relates generally to stands for televisions or other visual displays such as computer monitors, and more specifically, to stands with a vertically extending section that transitions to a horizontal base forward of the stand.

BACKGROUND

Visual displays such as televisions, video monitors, and computer monitors are well known and widely used. The tendency has been to provide displays with increasingly thinner profiles, especially in relation to their lengths and widths. As the profiles have gotten thinner, it has become more challenging to provide an attractive and functional way of supporting them on a support surface such as a desk, a table, or a dresser. Many known stands lack a sleek, thin appearance that is compatible and commensurate with a thin-profile television. In addition, certain televisions are used in conjunction with speaker systems, and it is desirable to provide an integrated, appearance by connecting the speaker system to the stand of the television. Thus, a need has arisen for an improved visual display stand.

SUMMARY

In accordance with a first aspect of the present disclosure, a visual display stand is provided which comprises a first member and a second member. The first member comprises a horizontal base section defining a base plane having a length along a first axis and a width along a second axis, and a vertically extending section that is spaced apart from the horizontal base section along the second axis and extends away from the base plane at an angle of greater than zero degrees and no more than 90 degrees relative to the base plane. The second member comprises a first surface that engages the vertically extending section and a second base surface that is coplanar with the base plane. In certain examples, the angle is from about 40 degrees to about 60 degrees. In the same or other examples, the first member comprises a metal. In the same or other examples, the first member has a thickness of from about 2 mm to about 8 mm. In other examples, the first and second member are fixedly attached to one another. In still other examples, the first and second member are integrally formed as a unitary display stand.

In accordance with a second aspect of the present disclosure, a supported visual display system is provided. The system comprises a visual display comprising a first side having a screen, a second side opposite the first side, and a bottom having at least one slot. The system further comprises a visual display stand which comprises a first member and a second member. The first member comprises a horizontal base section defining a base plane having a length along a first axis and a width along a second axis, and a vertically extending section that is spaced apart from the horizontal base section along the second axis and extends away from the base plane at an angle of greater than zero degrees and no more than 90 degrees relative to the base plane. The second member comprises a first surface that engages the vertically extending section and a second base surface that is coplanar with the base plane. In certain examples, the angle is from about 40 degrees to about 60 degrees. In other examples, the angle is about 90 degrees. In the same or other examples, the first member comprises a metal. In the same or other examples, the first member has a thickness of from about 2 mm to about 8 mm. In other examples, the first and second member are fixedly attached to one another. In still other examples, the first and second member are integrally formed as a unitary display stand.

In accordance with a third aspect of the present disclosure, a supported visual display system is provided which comprises a visual display and a visual display stand member. The visual display stand member comprises a horizontal base section defining a base plane having a length along a first axis and a width along a second axis, and a vertically extending section that is spaced apart from the horizontal base section along the second axis and extends away from the base plane at an angle of greater than zero degrees and no more than 90 degrees relative to the base plane. The visual display stand is attached to the visual display such that the horizontal base plane and the visual display are spaced apart along a third axis perpendicular to the base plane, and along the second axis.

In accordance with a fourth aspect of the present disclosure, an audio-visual system is provided. The audio-visual system comprises a visual display, a visual display stand, and at least one speaker. The visual display stand comprises a first member and a second member. The first member comprises a horizontal base section defining a base plane having a length along a first axis and a width along a second axis, and a vertically extending section that is spaced apart from the horizontal base section along the second axis and extends away from the base plane at an angle of greater than zero degrees and no more than 90 degrees relative to the base plane. The second member comprises a first surface that engages the vertically extending section and a second base surface that is coplanar with the base plane. The first member is removably attached to the at least one speaker.

In accordance with a fifth aspect of the present disclosure, a method of supporting a visual display is provided. The method comprises providing a visual display having a first side comprising a screen and a second side opposite the screen and connecting a visual display stand member to the visual display, wherein the visual display stand member comprises (i) a horizontal base section defining a base plane having a length along a first axis and a width along a second axis, and (ii) a vertically extending section that is spaced apart from the horizontal base section along the second axis and extends away from the base plane at an angle of greater than zero degrees and no more than 90 degrees relative to the base plane. The method further comprises positioning the visual display such that the second side of the visual display abuttingly engages a wall, the visual display stand member rests on a support surface, and the vertically extending section is between the base plane and the screen in a direction along the second axis.

BRIEF DESCRIPTION OF THE DRAWINGS

FIG. 8A is a side elevational view of the visual display system of FIG. 1A supported on a table;

FIG. 8B is a side elevational view of the visual display system of FIG. 1A with the rear member removed from the visual display stand in which the visual display is supported on a table and by a wall;

FIG. 8C is a side elevational view of the visual display of FIG. 1A mounted on a wall without the stand of FIG. 1A;

FIG. 11A is a side, cross-sectional view of a wall-mounted audio visual system comprising a visual display, the visual display stand of FIGS. 1A-4, and a soundbar removably attached to the visual display stand;

FIG. 11B is a side cross-sectional view of a wall-mounted audio visual system comprising a visual display, the visual display stand of FIGS. 9 and 10, and a soundbar attached to the visual display stand;

FIG. 11C is a side cross-sectional view of a wall-mounted audio visual system comprising a display, a vertical section of a T-shaped visual display stand with the lower, horizontal base member removed, and a soundbar attached to the vertical section of the display stand; and FIG. 11D is a side-elevational view of the T-shaped visual display stand of FIG. 11C in a stand-alone configuration with the lower, horizontal base-member attached.

Like reference numerals refer to like parts when referring to the drawings herein.

DETAILED DESCRIPTION

As discussed below, the present disclosure provides a stand for a visual display such as a television, a video monitor, or a computer monitor. In certain examples, the stand has first member with a thin profile and gives the display the appearance of defying gravity when viewing the screen side of the display because it appears that the weight of the display should generate a moment that would cause the stand and the display to tip over. However, due to a second member that is generally obscured from view behind the first member, the display appears to defy gravity from certain viewing angles.

Figure 1A:
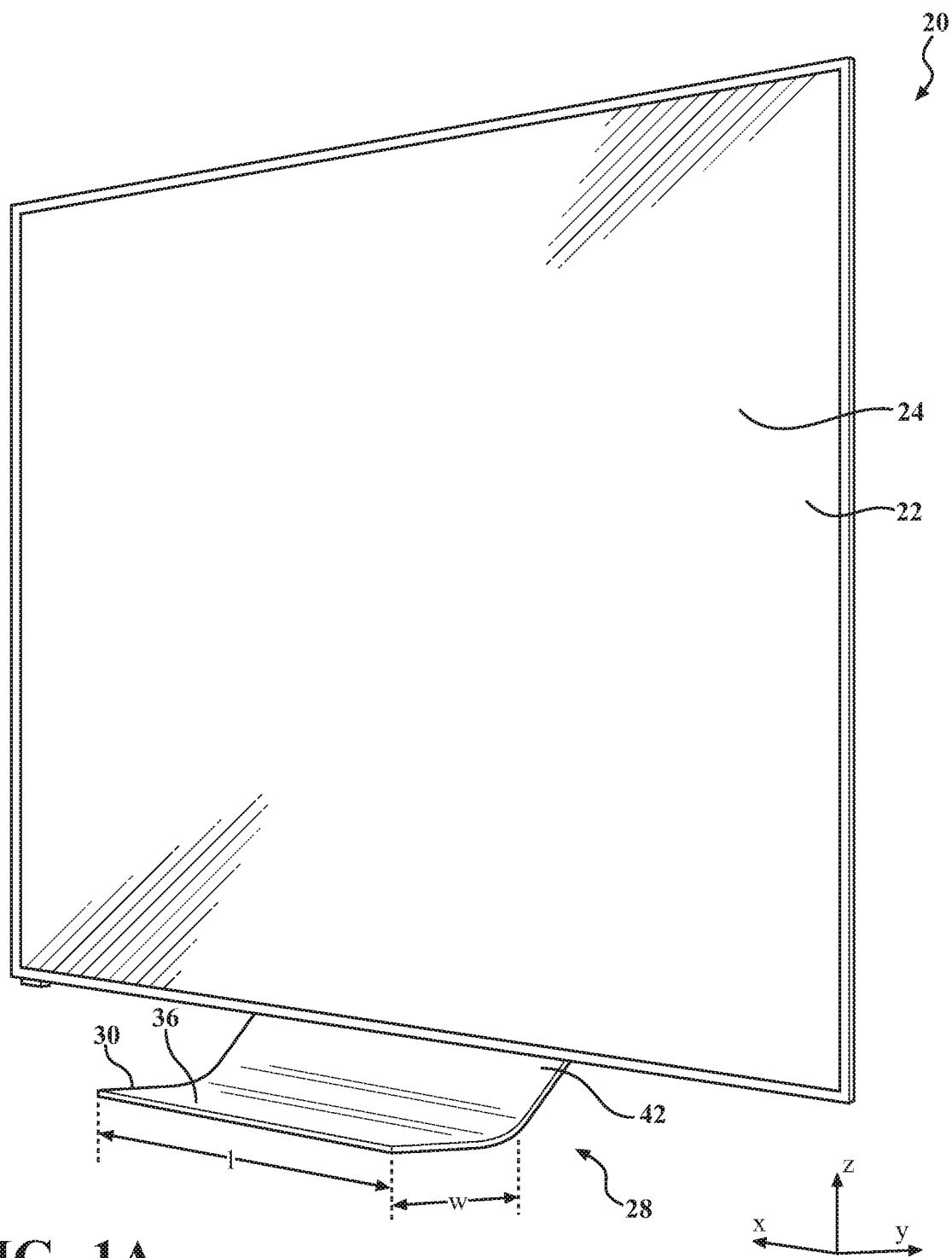
FIG. 1A is a front perspective view of a supported visual display system comprising a visual display and a stand.
Figure 1B:
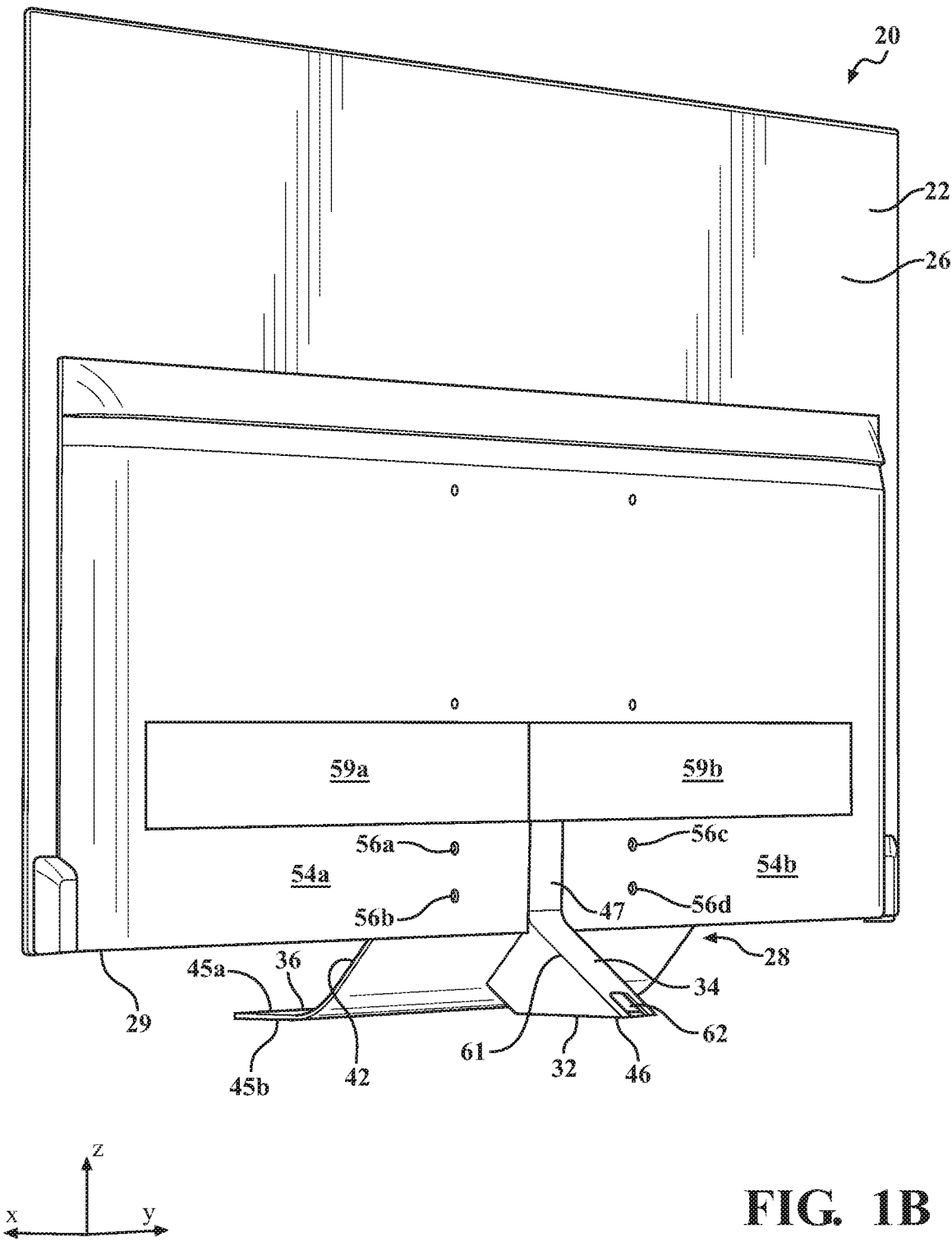
FIG. 1B is a rear perspective view of the supported visual display system of FIG. 1A.
Figure 2:
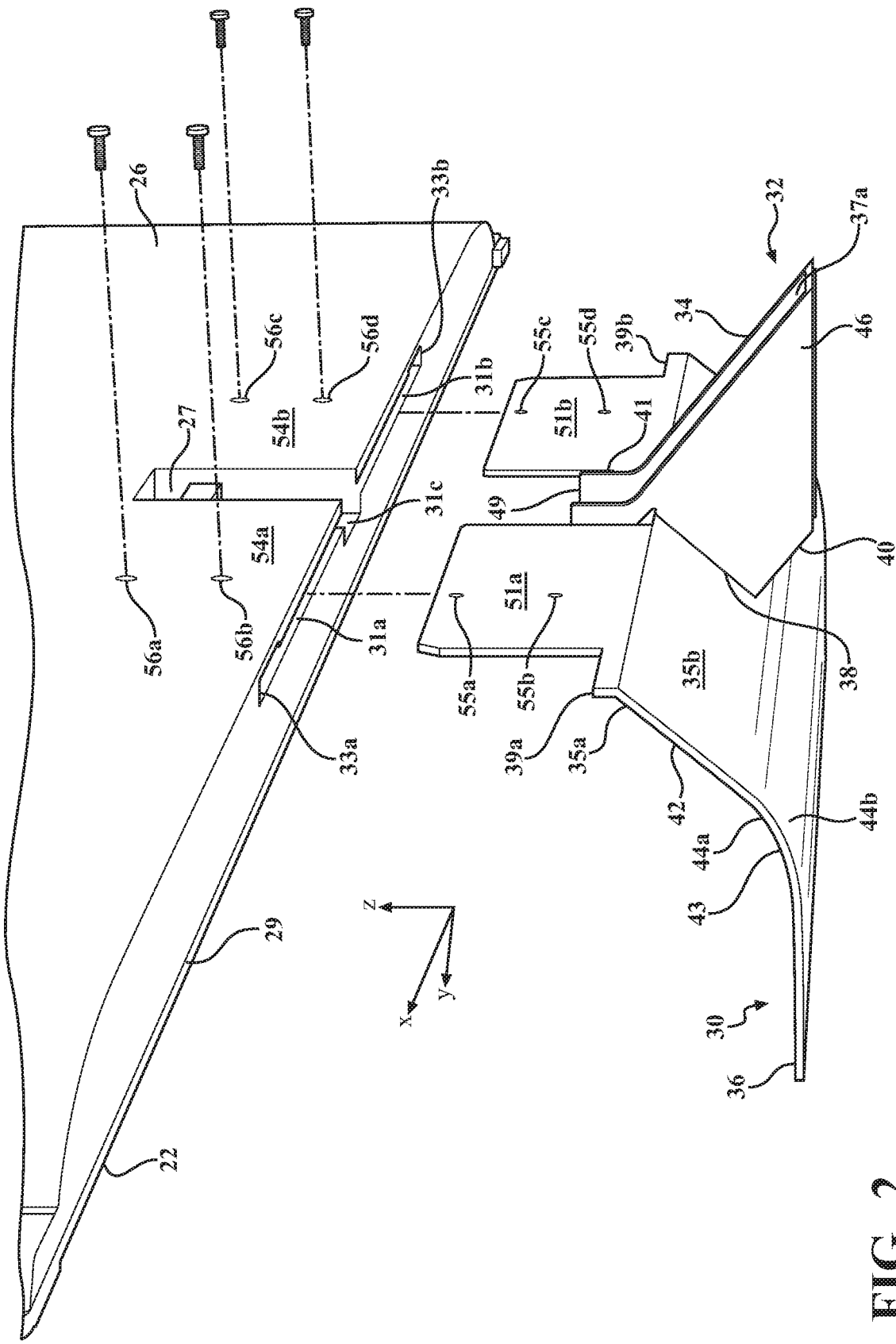
FIG. 2 is a rear perspective exploded view of the visual display of FIG. 1A and a stand therefor.

Referring to FIGS. 1A and 1B, a supported visual display system 20 is depicted. The supported visual display system 20 comprises a visual display 22 and a stand 28. Stand 28 comprises a first member 30 and a second member 32 (not visible in FIG. 1A). Display 22 has a first side 24 comprising a screen and a second side 26 (not visible in FIG. 1A) opposite the first side 24. When supported by stand 28 and resting on a support surface the first side 24 of display 22 lies generally in the x-z plane. The stand 28 is removably attached to display 22 as best seen in FIGS. 1B and 2.

Stand 28 comprises a first member 30 and a second member 32. First member 30 is preferably thin and has a thickness ranging from about 2 mm to about 8 mm, preferably from about 3 mm to about 7 mm, and more preferably from about 3 mm to about 5 mm. First member 30 has a first major surface 35a (FIG. 4) and a second major surface 35b (FIG. 2) opposite the first major surface 35a. The first major surface 35a and second major surface 35b are the largest surfaces on the first member 30. The thickness of first member 30 at a given location on first major surface 35a or second major surface 35b is the distance between the first major surface 35a and the second major surface 35b along the direction of a normal (perpendicular vector) to those surfaces. Because of the non-linear shape of the first member 30, the thickness is not along one of the cartesian coordinate axes except at certain locations on the surfaces 35a and 35b.

First member 30 comprises a horizontal base section 36 that comprises an upper surface 45a, which is a portion of first major surface 35a, and a lower surface 45b, which is a portion of second major surface 35b. The upper and lower surfaces 45a and 45b of horizontal base section 36 define respective parallel base planes having a length/along the x-axis and a width w along the y-axis. The base plane length/is greater than the base plane width w. In certain examples, the ratio of the length/to the width w is from about 4 to about 12, preferably from about 6 to about 10, and more preferably from about 7 to about 8. In certain examples, the thickness of the first member 30 is no more than about ten percent, preferably no more than about eight percent, and still more preferably no more than about six percent of the base plane width w. At the same time, the base plane width w is no less than about two percent, preferably no less than about three percent, and more preferably no less than about five percent of the base plane width.

First member 30 further comprises a vertically extending section 42 that is spaced apart from the horizontal base section 36 and the base planes defined by its upper and lower surfaces 45a and 45b. Vertically extending section 42 also extends away from the horizontal base section 36 along the y-axis and relative to the base section 36 and the base planes defined by the upper and lower surfaces 45a and 45b of horizontal base section 36. When the stand 28 is resting on a horizontal support surface (e.g., table, shelf, etc.), the vertically extending section 42 defines an angle a relative to the base planes defined by base section 36 that is from about 40 degrees to about 60 degrees, preferably from about 45 degrees to about 55 degrees, and more preferably from about 47 degrees to about 51 degrees.

Figure 1C:
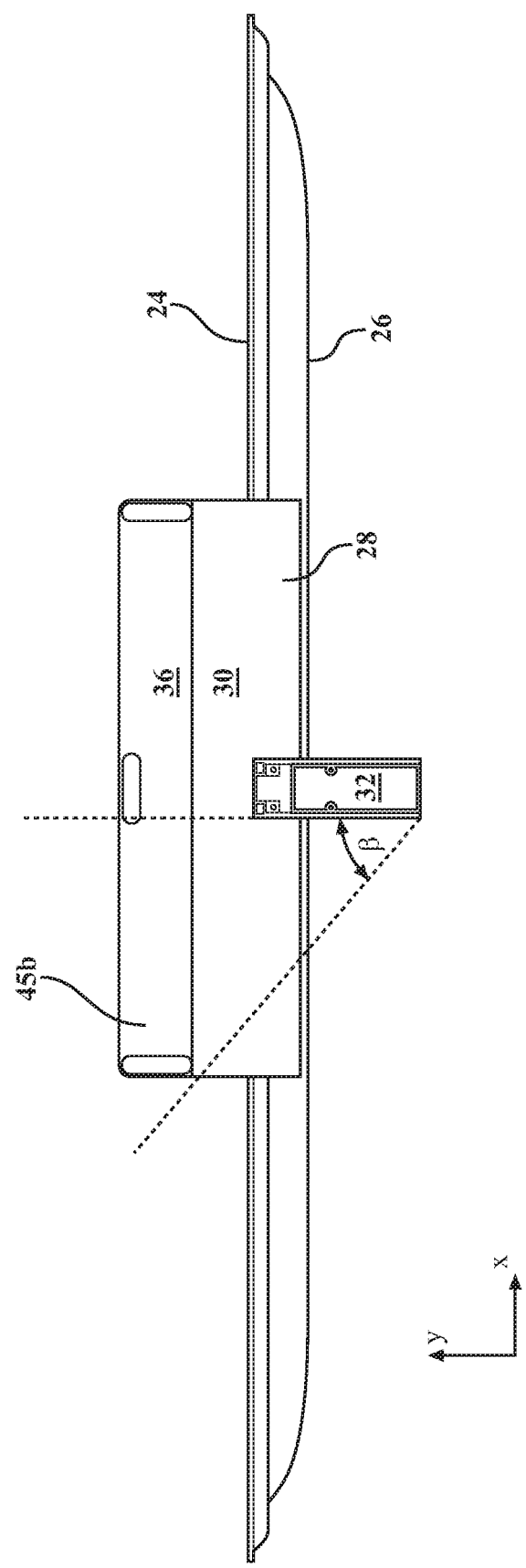
FIG. 1C is a bottom plan view of the supported visual display system of FIG. 1A used to illustrate the field of view in which the display stand's second support member is obscured from view.
Figure 4:
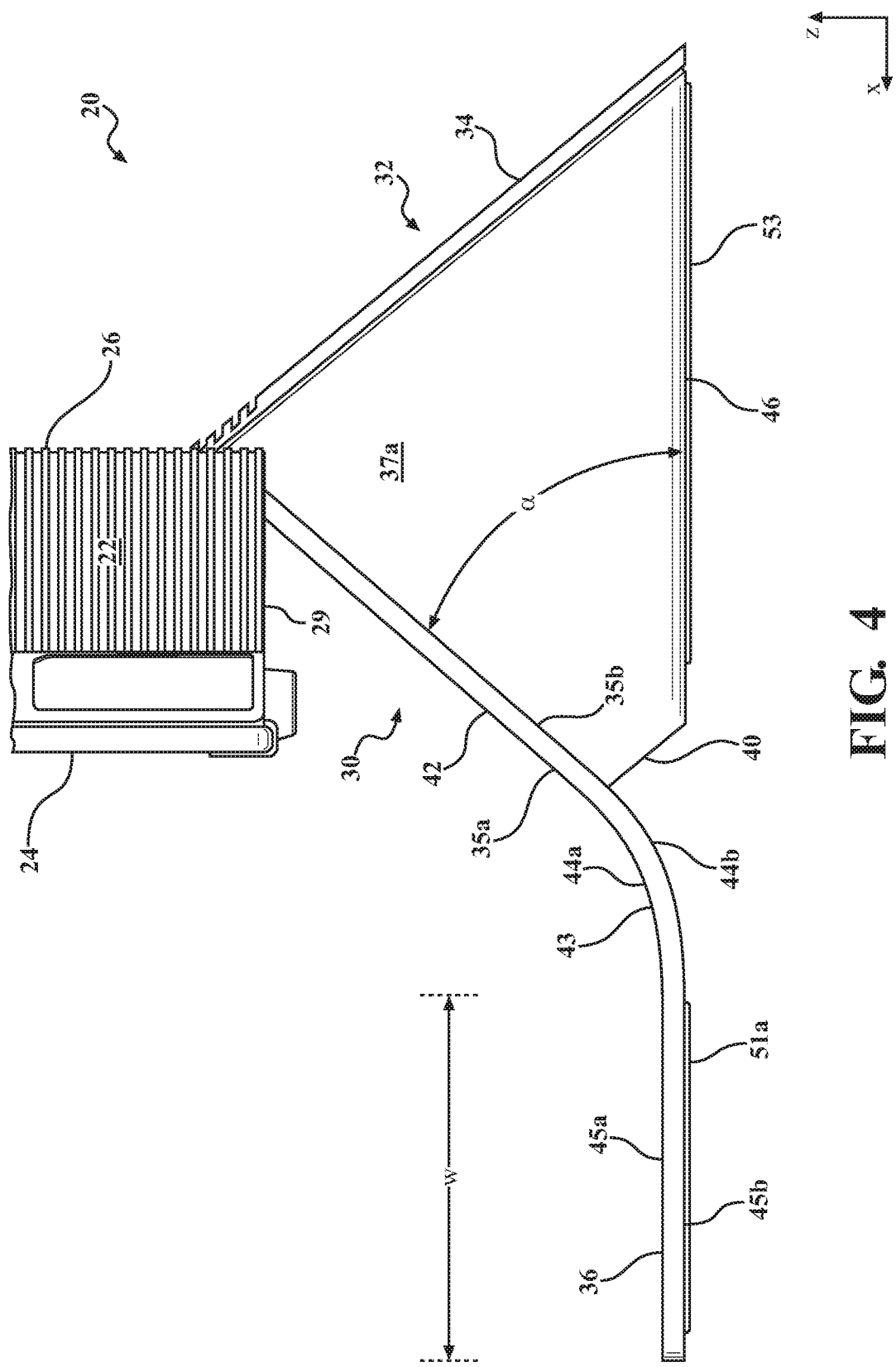
FIG. 4 is a close-up, side elevational view of the visual display system of FIG. 1A.

Horizontal base section 36 is connected to and spaced apart along the y-axis from vertically extending section 42 by a transition section 43 (FIG. 4). The y-axis spacing contributes the gravity-defying appearance of the visual display stand 28. Transition section 43 has a first side 44a opposite a second side 44b. First side 44a is concave and second side 44b is convex. FIG. 1C illustrates a field of view in which the second member 32 is not visible, thus making the first member 30 look unsupported and gravity defying. As shown in FIG. 1C, the second member 32 is obscured from view when viewing the screen side 24 of the display 22 within a field of view defined by an angle β that is preferably at least about −40 degrees to about +40 degrees, preferably at least about −45 degrees to about +45 degrees, and more preferably from about −50 degrees to about +50 degrees from a vector normal to the screen 24 at the location of the second member 32 along the x-axis.

First member 30 is preferably formed from a substantially rigid material such as a plastic or metal. In certain examples, the first member 30 has a density of less than about 4 g/cm$^3$, preferably less than about 3.5 g/cm$^3$, and more preferably less than about 3.0 g/cm$^3$. In one example, the first member 30 comprises aluminum, preferably consists essentially of aluminum, and more preferably consists of aluminum. The first member 30 is preferably a unitary structure, such as an integrally formed, single piece.

Second member 32 of stand 28 is formed from a substantially rigid material such as plastic or metal. Plastic is preferred. Second member 32 is connected to rear surface 35b of first member 30 as best seen in FIG. 2. Second member 32 includes a base surface 46 which is substantially co-planar with the bottom surface 45b of horizontal base section 36 of the first member 30, i.e., lying in the x-y plane. Second member 32 also includes first side 37a and second side 37b (not visible) which are the two major surfaces of second member 32 and which are spaced apart along the x-axis and which lie generally in the x-y plane.

Second member 32 also includes an engagement surface 38 (FIG. 2) which abuttingly engages rear surface 35b of first member 30. The engagement surface 38 of second member 32 is preferably co-planar with rear surface 35b of second member 32. A downward sloping surface 40 connects engagement surface 38 with base surface 46 and is oriented perpendicularly to rear surface 35b of first member 30. Side 34 is parallel and opposite to downward sloping surface 40. Second member 32 includes an internal space for retaining cables used by visual display 22.

In the figures herein, first member 30 and second member 32 are removably connected to one another. In additional examples, however, first member 30 and second member 32 may be fixedly attached to one another. In other examples, first member 30 and second member 32 may be integrally formed as a unitary visual display stand.

Referring to FIGS. 1B and 2, side 26 of the display 22 includes first connection panel 54a and second connection panel 54b, which are on opposite sides of and adjacent to wire management vertical channel cover 47. Panel 54a includes fastener openings 56a and 56b for receiving respective fasteners that secure display stand connector panel 51a to panel 54a. Similarly, panel 54b includes fastener openings 56c and 56d for receiving respective fasteners that secure display stand connector panel 51b to panel 54b. Wire management covers 59a and 59b are adjacent panels 54a and 54b along the z-axis in a direction away from display bottom 29. The wire management covers 59 and 59b conceal various wires or cables from view, as described further below.

Side 34 of second member 32 of display stand 28 comprises a removable cover 61 that can be selectively attached to and detached from second member 32 to conceal the cables from view. Cover 61 (FIG. 1B) is positionable over the open area of side 34 to partially conceal the cables, and depressible opening cover 62 provides a path for the cables to exit the second member 32 for connection to a power source or accessory (DVD, videogame, stereo), as appropriate. Depressible opening cover 62 is resilient so that finger pressure can be used to open it. A user can insert his or her finger in the opening concealed by cover 62 and then peel cover 61 off to expose the wires or cables running through the second member 32, as described further below.

The internal space within second member 32 is also in communication with a channel 49 (FIG. 2) formed in upward extension 41. Upward extension 41 is connected to side 34 and extends vertically away from base surface 46 in a direction along the z-axis. Upward extension 41 is used to receive cables from visual display 22, as described further below.

As mentioned previously, second member 32 may be secured to first member 30 by a variety of different connection techniques, including mechanical fasteners, adhesives, etc. However, second member 32 is preferably removably attachable to first member 30 to facilitate switching between different methods of mounting and supporting the visual display 22, as described further below. In one example, screws may be inserted through the engagement surface 38 of second member 32 via the internal space within second member 32 and screwed into the rear surface 35b of first member 30.

Referring to FIG. 2, first member 30 includes connector panels 51a and 51b which are inserted in the rear of visual display 22 through slots 31a and 31b in the bottom 29 of the visual display 22. Panels 54a and 54b on the rear of the visual display 22 conceal the first member connector panels 51a and 51b when the first member 30 is in an installed condition on the visual display 22. The panels 54a and 54b each include respective pairs of fastener holes 56a/56b and 56c/56d which align with corresponding pairs of fastener holes 55a/55b and 55c/55d formed in the connector panels 55a and 51b. Connectors such as screws, bolts, rivets, etc. may be used to secure connector panels 55a and 51b to panels 54a and 54b. In the example of FIG. 2, the slots 31a and 31b in the bottom 29 at the rear of visual display 22 are in communication with one another and with a central slot 31c which receives upward extension 41 of second member 32. A cover 47 (FIG. 1B) extends over opening 27 and conceals the channel 49 from view when the stand 28 is installed on the visual display. Stops 39a and 39b extend upward along the z-axis and project away from the panels 55a and 51b along the x-axis. Stops 39a and 39b engage corresponding engagement surfaces in the interior of the visual display 22 to limit the z-axis insertion of the first member 30 into slots 31a and 31b. The ends of the stops 39a and 39b preferably fit closely to the ends 33a and 33b of slots 31a and 31b. In an installed condition, the connector panels 51a and 51b are preferably fully inserted within the visual display 22 so that edge 66 at the top of the vertically extending section 42 is flush with the bottom surface 29 of visual display 22.

Figure 3:
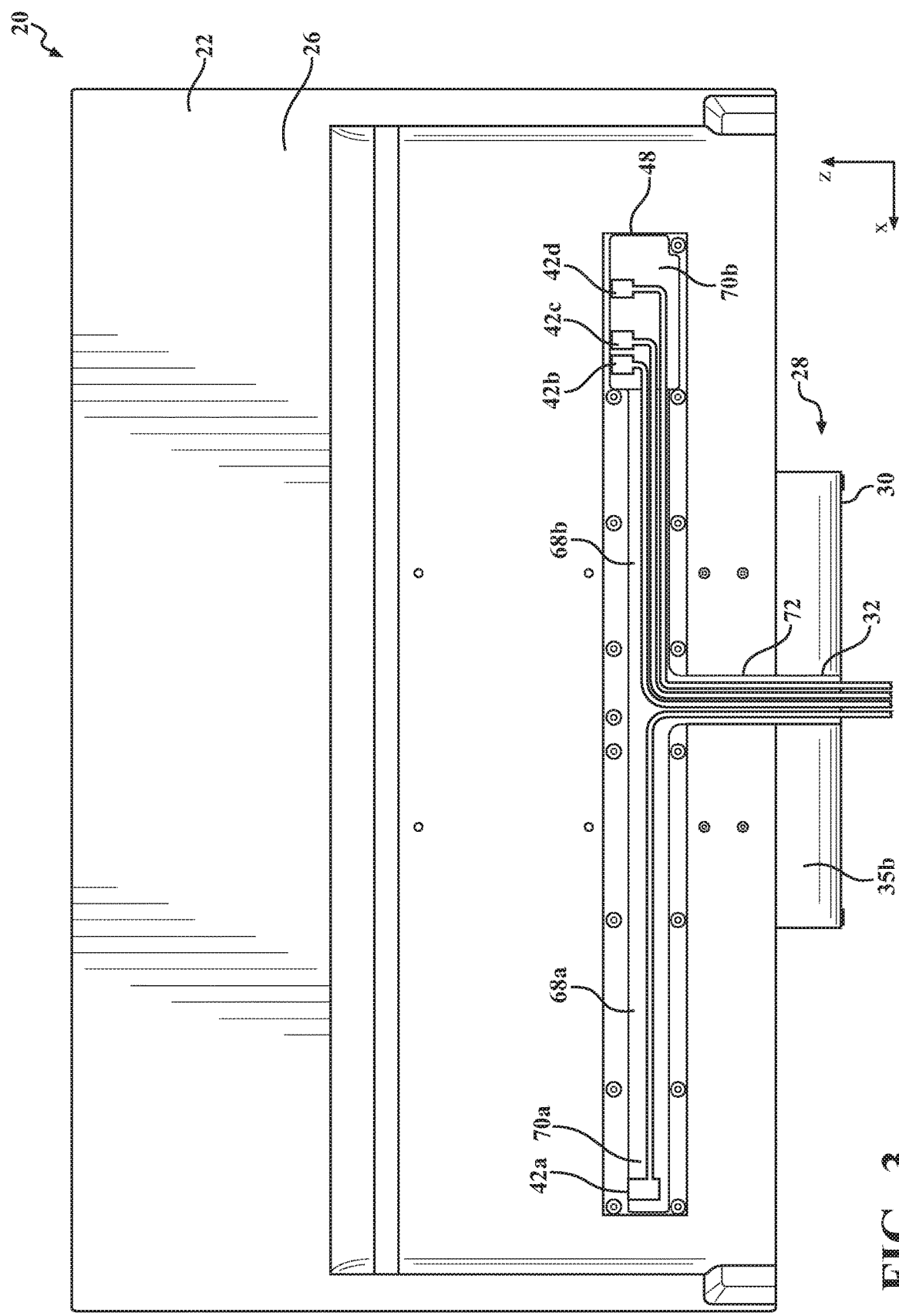
FIG. 3 is a rear elevational view of the visual display system of FIG. 1 showing a cable management system.

The interior of the second member 32 and the channel 49 provide a streamlined way of routing cables from the rear of the visual display 22 to their respective destinations. Referring to FIG. 3, wire management covers 59a and 59b (FIG. 1B) are removed to expose cable connecting recess 48. Recess 48 is in communication with the channel 49 formed in the upward extension 41 of second member 32 and is preferably covered. The term "in communication" in this context refers to the fact that recess 48 connects directly to channel 49 when the upward extension 41 of second member 32 is inserted into the slot 31c allow for the cables to go through recess 48. Recess 48 also includes a power connector section 70a and an audio/video connector section 70b that are in communication with one another via channels 68a and 68b. Channels 68a and 68b combine into a main channel 72 proximate the second member channel 49. Power connector section 70a comprises a power connector 42a. Audio/video connector section 70b comprises connectors 42b-42d. The cables connected to the various connectors 42a-42d are routed through the channels 68a and 68b, main channel 72, second member channel 49 and out through second member depressible opening cover 62 for connection to power, audio, or video, as appropriate. Covers 59a and 59b are removably placed over recess 48 to provide an attractive cable management solution that conceals the various power, audio, and video cables from view while keeping them securely positioned and routed. Cover 47 is removably placed over the second member channel 49 to hide the cables in the second member. Covers 59a and 59b are preferably snap-fittingly engaged into grooves around the perimeter of recess 48, and cover 47 (FIG. 1B) is preferably snap fittingly engaged to the edges of panels 54a and 54b (FIG. 2). Cover 61 is also preferably snap-fittingly engaged to second member 32. To remove the covers, a user inserts his or her finger into depressible cover 62. Once a finger is thus inserted, it can be used to separate cover 61 from second member 32. Cover 47 will then have an exposed edge proximate the second member 32 and can be lifted with a finger as well. Once cover 47 is removed, there will be an opening beneath cover 59b, which allows it to be removed, after which cover 59a can be removed. The covers 61, 57, 59a and 59b may subsequently be snap fit back into place.

As shown in FIGS. 1B and 2, the second member 32 preferably has a width along the x-axis that is less than the length of the first member 30 and the vertically extending section 42 thereof along the x-axis. The second member 32 width along the x-axis is preferably no more than half, more preferably no more than one-third, and still more preferably no more than one-fourth of the length of the first member 30 along the x-axis. The reduced width of the second member 32 along the x-axis relative to the length of first member 30 along the x-axis facilitates concealing the second member 32 from view and maintaining the gravity-defying appearance described previously. From its point of installation on the bottom 29 of visual display 22, the first member 30 extends solely and progressively in one direction along the y-axis, i.e., the direction defined by moving from the second side 26 to the first (front) side 24 of the display 22 (along the y-axis) and in one direction along the z-axis (downward toward the support surface on which the horizontal base section 36 rests). The first member 30 does not "double back" along the y-axis like many known visual display stands. In addition, when viewing the screen side 24 of the visual display within the field of view described previously, the only visible support member is first member 30 which appears to be unsupported from behind. This configuration makes the stand 28 and visual display 22 appear to defy gravity.

Referring to FIG. 4 when the stand 28 is in an installed condition on the visual display 22, the stand 28 may be placed on a horizontal support surface. Gripping surfaces 57a (which would have a parallel counterpart spaced apart along the x-axis) and 53 (such as rubber or another frictional surface) may be placed on the bottom of the horizontal base section 36 of the first member 30 and on the bottom of second member base surface 46, respectively. In an installed condition, the horizontal base section 36 is preferably spaced apart from the first side 34 (screen side) of the visual display 22 in a direction along the y-axis. The y-axis spacing between the horizontal base section 36 and the first side 24 of the display 22 is preferably at least about 30 mm, preferably at least about 40 mm, and more preferably at least about 50 mm. The horizontal base section 36 is preferably spaced apart from the bottom 29 of the visual display 22 along the z-axis by at least about 50 mm, preferably at least about 60 mm, and more preferably at least about 70 mm. The y-axis length of the stand 28 from the rear-most portion of the second member 32 to the foremost portion of the first member 30 is from about 200 mm to about 280 mm, preferably from about 220 mm to about 260 mm, and more preferably from about 230 mm to about 250 mm.

Like the horizontal base section 36, the vertically extending section 42 of first member 30 is preferably planar. Referring to FIG. 4, the y-axis borders of the transition section 43 are located at the point where the first member 30 begins to exhibit curvature to the right of the horizontal base section 36 and the left of the vertically extending section 42 along the y-axis. As described previously, transition section 43 is curved and is preferably spaced apart from the front side 24 of the display 22 along the y-axis. In certain examples, it may also be desirable to use multiple stands 28 attached to a single display 22 and spaced apart from one another along the length axis The visual display system 20 is preferably modular and configured so that the display 22 may be supported or mounted in a variety of ways. Referring to FIGS. 8A-8C, three methods of supporting and/or mounting the display 22 are shown. In FIG. 8A the visual display system 20 is in the assembled condition of FIGS. 1A and 1B and is supported on a table 60. The lower surface 45b of horizontal base section 36 of first member 30 and the base surface 46 of second member 32 are substantially co-planar and rest on (abuttingly engage) a table 60. In this configuration, the visual display system 20 is free-standing because the second member 32 supports the system 20 an prevents it from falling over.

In another example, shown in FIG. 8B, first member 30 is attached to the visual display 22 as shown in FIG. 2. However, the second member 32 is not provided. Instead, the visual display system 20 (without second member 32) is positioned with the second side 26 of the visual display 22 abuttingly engaging a vertical support surface such as wall 64. As with FIG. 8a, the horizontal base section 36 rests on table 60 and the wall 64 provides the support otherwise provided by second member 32. In this example, while second member 32 is not provided, the first member 30 and its attachment to display 22 is as described previously. As suggested by FIG. 8B, the visual display system 20 has a supported configuration in which the visual display 22 abuttingly engages a wall in order to keep the visual display 22 in an upright configuration (i.e., positioned so that the front surface 24 of visual display 22 lies generally in the x-z plane). In an unsupported configuration, the visual display 22 does not abuttingly engage a vertical support surface. Because second member 32 is not provided, the visual display stand 28 does not include a component that applies a force against the vertically extending section 42 and which has a component orthogonal to the plane in which the front 24 and 26 rear surfaces of the vertically extending section 42 lie. As a result system 20 becomes top heavy, and the force of gravity creates a moment about a rotational axis parallel to the length (x) axis which would cause the display 22 and stand 28 to fall over and essentially rotate about the rotational axis. Thus, without second member 32, the visual display system 20 cannot remain oriented with the display 22 in a stably upright configuration.

Alternatively, and as shown in FIG. 8C, display 22 may be attached to a mounting bracket 63 that is attached to wall 64. In this case, the stand 28 is removed in its entirety. Thus, stand 28 may be provided and may be used with visual display 22 in its fully or partially assembled configurations, as depicted in FIGS. 8A and 8B, or not used at all as depicted in FIG. 8C. Preferably, the stand may be removably attached to the display 22 to facilitate easy switching between the three configurations of FIGS. 8A-8C. The audio visual system of FIG. 5 may also be configured as shown in FIGS. 8A and 8b. Although not separately depicted, a plurality of visual display stands 28 may be attached to a single visual display 22 and spaced apart or adjacent to one another along the x-axis.

Figure 5:
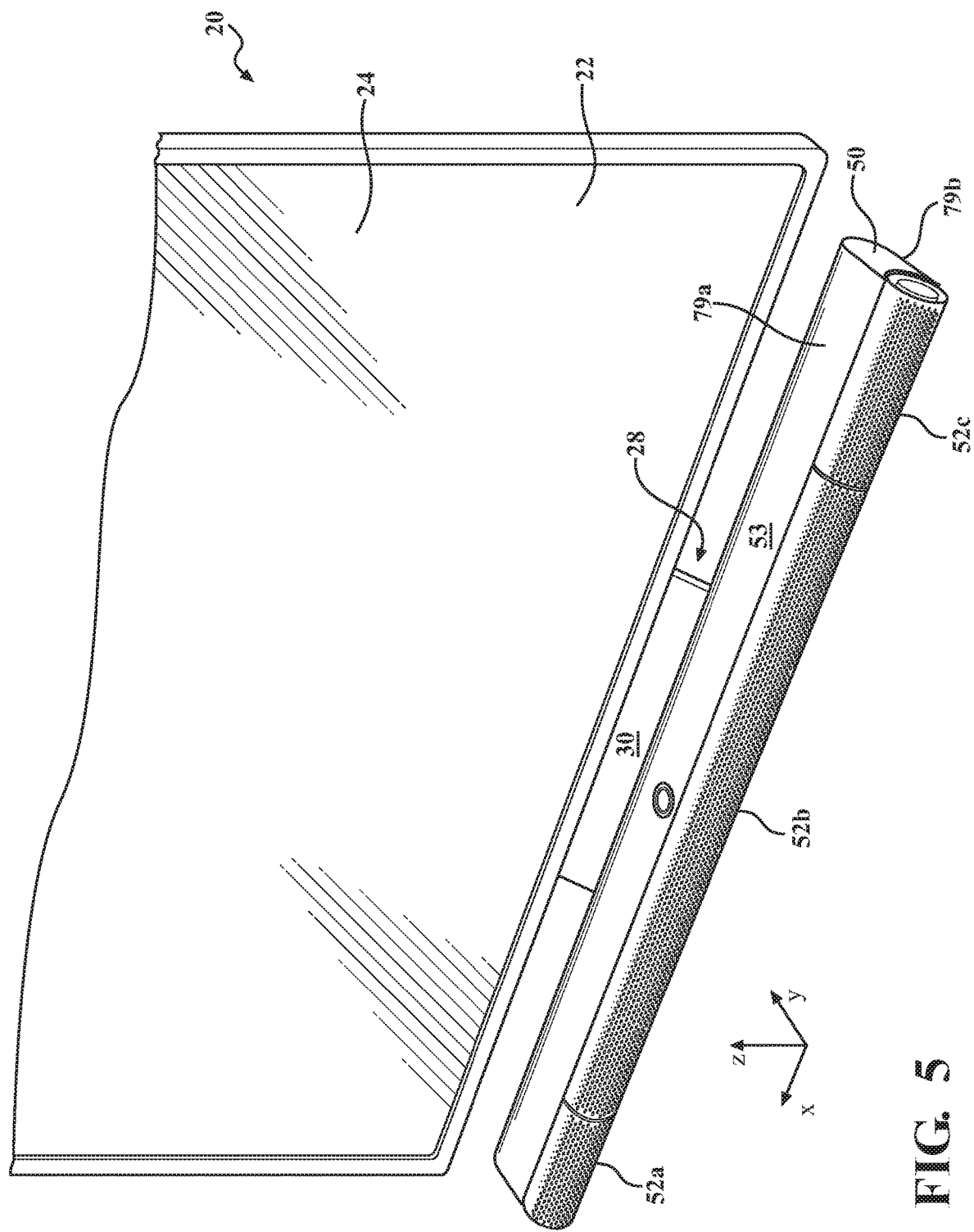
FIG. 5 is a front perspective view of an audio-visual system comprising the visual display system of FIG. 1A and a speaker system.
Figure 6:
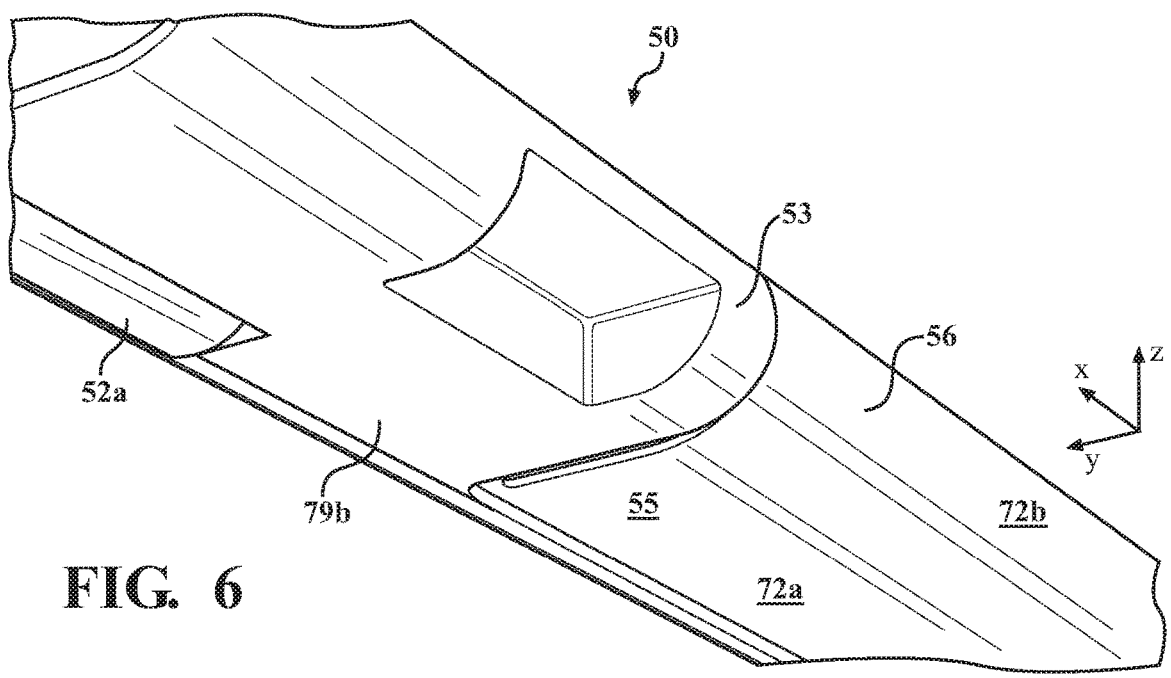
FIG. 6 is a close-up bottom perspective view of the speaker system of FIG. 5.
Figure 7:
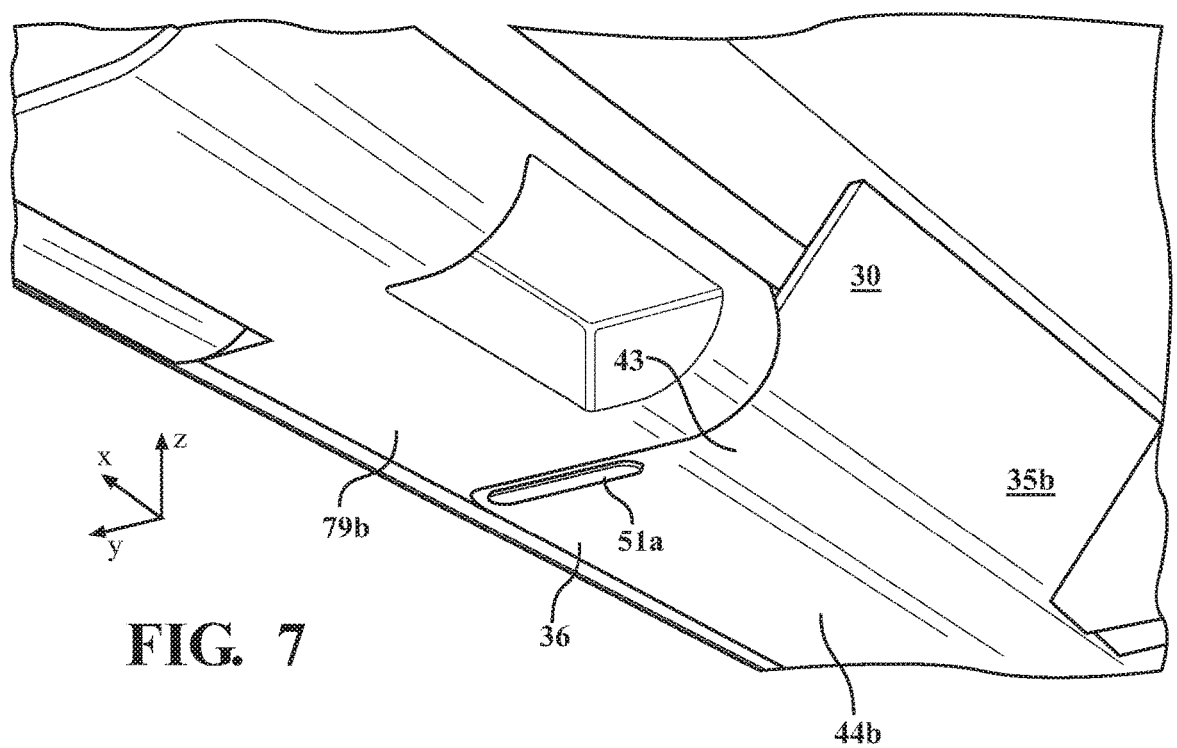
FIG. 7 is a close-up, bottom perspective view of the visual display and sound system of FIG. 5.

The shape of the first member 30 beneficially facilitates its attachment to speaker systems to provide an audio-visual system with a an attractive, streamlined appearance, Referring to FIGS. 5-7, a speaker system 50 is provided and is removably attached to first member 30 of the display stand 28 to define an audio-visual system. The speaker system 50 is a sound bar that has a top surface 79a and a bottom surface 79b spaced apart from one another along the z-axis. The speaker system 50 comprises at least one speaker, which in the depicted example is three speakers, 52a-52c. Speakers 52a and 52c are left and right speakers, respectively, and speaker 52b is a central speaker located between the right and left speakers 52a and 52c along the x-axis. Speaker housing 53 is provided and houses the speaker circuitry. Speakers 52a-52c are cylindrical with lengths along the x-axis. Housing 53 is generally rectangular and elongated along the x-axis. Speaker system 50 is preferably spaced apart from the front side 24 of the display 22 along the y-axis. As best seen in FIGS. 6 and 7, the housing 53 of speaker system 50 includes a central recess 55 that includes a planar section 72a on the underside of the speaker housing 53 and a rear curved section 72b. The planar section 72a preferably has a shape that is complementary to the shape of the horizontal base section 36 of first member 30 and the rear curved section 72b preferably has a shape that is complementary to the shape of transition section 43 of first member 30. The depth of the recess 55 is preferably at least as great as the thickness of the first member 30 and may be the same as the thickness so the bottom surface of the housing 53 is flush with the second side 44b of horizontal base section 36 of the first member 30. A plurality of spring locks, such as spring lock 56, may be provided which engage the sides of the first member 30 to secure the first member 30 to the speaker system 50. The spring locks 56 each comprise a spring-biased depressible member that is depressed outwardly from the first member 30 along the x-axis when first member 30 is inserted into recess 55 and which then are pushed over the surface of the first member 30 by their respective biasing springs to lock them into place. The depressible members may then be pushed outwardly from the first member 30 along the x-axis to remove the speaker system 50 from the stand 28. As shown in FIG. 5, a portion of the first member 30 is visible when viewing the audio-visual system from the front side 24 of the display 22, providing a compact and modular system that appears to defy gravity.

Figure 9:
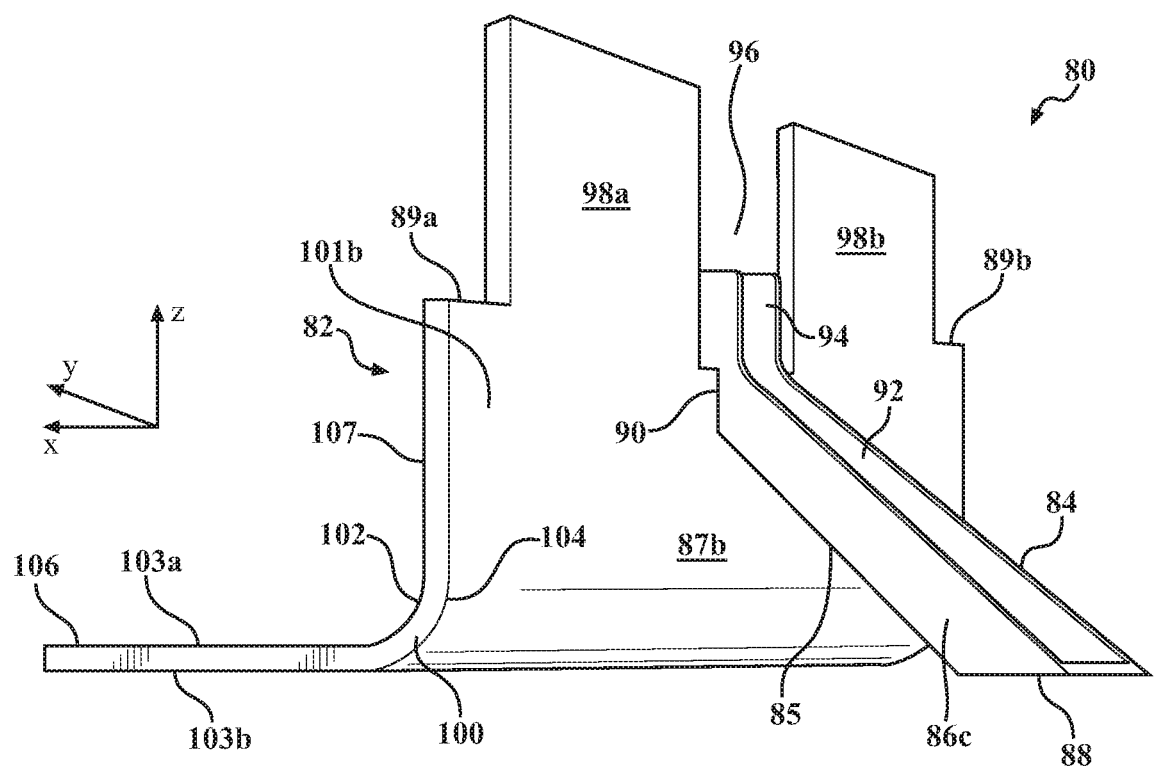
FIG. 9 is a rear perspective view of another example of a visual display stand in accordance with the present disclosure.
Figure 10:
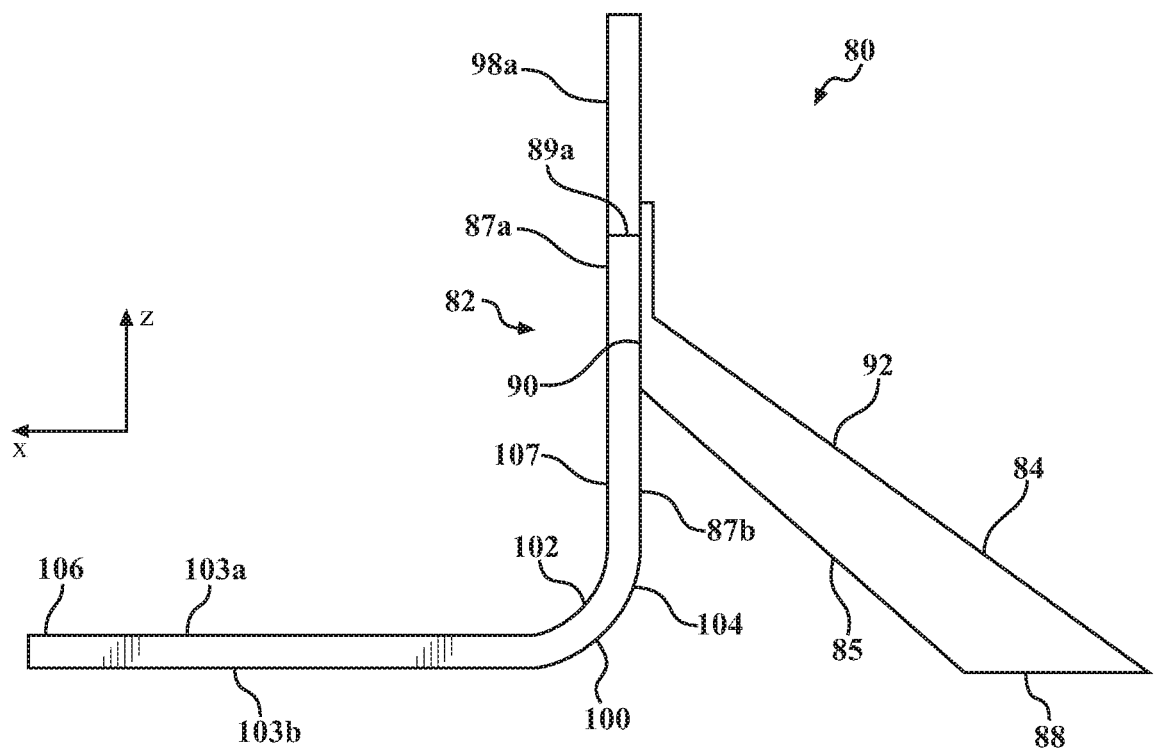
FIG. 10 is a side elevational view of the visual display stand of FIG. 9.

Referring to FIG. 9, another example of a visual display stand 80 is depicted. Visual display stand 80 comprises a first member 82 and a second member 84. First member 82 comprises a first major surface 87a and a second major surface 87b (FIG. 10) which define opposite sides of first member 82. First member 82 also comprises a horizontal base section 106 with an upper surface 103a and a lower surface 103b spaced apart along the z-axis. The upper surface 103a and lower surface 103b each define respective, parallel horizontal base planes having a length/along the x-axis and a width w along the y-axis. First member 82 is preferably made of the same materials and has the same thickness as first member 30 of visual display stand 28.

First member 82 also comprises a vertically extending section 107 that is spaced apart from horizontal base section 106 along the y-axis. Vertically extending section 107 extends away from the horizontal base section 106 and the base planes defined by its upper and lower surfaces 103a and 103b along the z-axis, or put differently, at a ninety degree angle relative to the base planes. Vertically extending section 107 has a first side 101a and a second side 101b spaced apart along the y-axis.

Horizontal base section 106 and vertically extending section 107 are spaced apart from one another along the y-axis and connected by transition section 100. Transition section 100 has a concave side 102 and a convex side 104. Vertically extending connector panels 98a and 98b are configured similarly to corresponding panels 51a and 51b in the example of FIGS. 1A-4, and stops 89a and 89b are configured similarly to stops 39a and 39b.

Second member 84 is similar to second member 32 of FIGS. 1A-4 but has a slightly altered geometry to accommodate the vertical orientation of vertically extending section 107 of first member 82. Second member 84 includes an engagement surface 90 that mates with second side 101b of vertically extending section 107 of first member 82. Engagement surface 90 is parallel to and co-planar with second side 101b of vertically extending section 107 of first member 82. Base surface 88 is substantially co-planar with the horizontal base plane defined by lower surface 103b of horizontal base section 106 and is substantially perpendicular to engagement surface 90. Downward sloping side 85 slopes away from rear surface 101b of vertically extending section 107 along the y-axis and connects the engagement surface 90 and base surface 88.

Side 92 is opposite to downward sloping side 85. Second member 84 includes an internal space for retaining cables used by visual display 22 (not shown in FIG. 9). Side 92 comprises a removable cover (not shown but similar to cover 61) that can be selectively attached to and detached from second member 84 to conceal the cables from view. The cover (not shown) is positionable over the open area of side 92 to partially conceal the cables, and an opening (not shown) similar to opening 62 provides a path for the cables to exit the second member 84 for connection to a power source or accessory (DVD, videogame, stereo), as appropriate.

Referring to FIG. 9, visual display stand 80 connects to visual display 22 via vertically extending connector panels 98a and 98b (screw holes are not shown) in the same way that connector panels 51a and 51b of first member 30 do. Upward extension 94 extends vertically along the z-axis from second member side 92 and includes a channel 96. The channel 96 cooperates with the visual display main channel 72 in visual display recess 48 to provide a cable management solution similar to that of visual display stand 28. In addition, horizontal base section 106 is selectively attachable to soundbar 50 via the soundbar's central recess 55 in the same way that horizontal base section 36 of first member 30 in FIGS. 1A-4 is. Visual display stand 80 may also be used in the free-standing configuration of FIG. 8A or the wall-abutting configuration of FIG. 8b (in which second member 84 is removed and wall 64 provides support for the display 22).

In another example shown in FIG. 11D, a horizontal base section 114 is provided, and a vertically extending member 112 is oriented at 90 degrees relative to the horizontal base section 114. The vertically extending member 112 is removably attached to the horizontal base section 114 midway along the y-axis length of the horizontal base section. The resulting visual display stand appears as an upside down "T" when viewed along the x-axis. Soundbar 50 may be connected to the horizontal base section in the manner described previously for the other visual display stands described herein.

The visual display stands 28 and 80 (and the "T" shaped design of FIG. 11D) may also be attached to soundbar 50 in a wall-mounted display configuration as shown in FIGS. 11A-11C. Referring to FIG. 11A, visual display 22 is attached to wall 64 via mounting bracket 63, which may be, for example, an open frame that hangs on hooks projecting from the wall 64, a plastic or metal piece that is affixed to the wall using drywall anchors, toggle anchors, or concrete anchors, as appropriate, or any kind of known visual display wall-mounting bracket. In FIG. 11A, first member 30 of visual display stand 28 is attached to soundbar 50 as previously described. In FIG. 11B first member 82 of visual display stand 80 is attached to soundbar 50 as previously described.

FIG. 11C depicts the visual display 22 wall-mounted in the same fashion as in FIGS. 11A and 11B. However, the vertical member 112 of the "T-shaped" visual display is used without its horizontal base 114 and is attached to soundbar 50 via connectors 118 (one of which his shown). The vertical member 112 of the visual display and connectors 118 are preferably designed to withstand the downward force generated by the weight of the soundbar 50 as sell as the torque or bending moment exerted by soundbar 50 on the connectors 118 and vertical member 112.

What is claimed is:

1. A visual display stand, comprising:
   a first member comprising (i) a horizontal base section defining a base plane having a length along a first axis and a width along a second axis, and (ii) a vertically extending section that extends away from the horizontal base section along the second axis and extends away from the base plane at an angle greater than 0 degrees and no more than 90 degrees relative to the base plane; and
   a second member comprising a first surface that engages the vertically extending section and a second base surface that is coplanar with the base plane, wherein a portion of the second base surface of the second member extends underneath the vertically extending section of the first member in a direction along the second axis.

2. The visual display stand of claim 1, wherein the base plane length is greater than the base plane width, and the first member has a thickness that is less than about 10 percent of the width of the base plane.

3. The visual display stand of claim 1, wherein the first member has a first side and a second side, the second member first surface engages the vertically extending section of the first member on the second side of the first member, and the visual display stand further comprises a transition section between the horizontal base section and the vertically extending section, wherein the transition section is concave when facing the first side of the first member.

4. The visual display stand of claim 1, wherein the angle is from about 40 degrees to about 60 degrees.

5. The visual display stand of claim 1, wherein the angle is about 90 degrees.

6. The visual display stand of claim 2, wherein the thickness is from about 2 mm to about 8 mm.

7. The visual display stand of claim 1, wherein the second member has a width along the first axis that is less than about ten percent of the base plane width along the second axis.

8. The visual display stand of claim 1, further comprising at least one display connector connected to the vertically extending section of the first member, wherein the at least one display connector extends away from the vertically extending section of the first member in a direction perpendicular to the base plane.

9. The visual display stand of claim 1, wherein the first member comprises a metal.

10. The visual display stand of claim 9, wherein the metal has a density of less than about 4 g/cm$^3$.

11. The visual display stand of claim 1, wherein the first member is integrally formed as a single piece.

12. The visual display stand of claim 1, wherein the first member has a maximum height along a height axis perpendicular to the base plane, and the second member has a maximum height along the height axis that is no less than the maximum height of the first member along the height axis.

13. The visual display stand of claim 1, wherein the second member has a cable channel.

14. The visual display stand of claim 13, wherein the second member has a display connector comprising part of the channel and extending above the first surface of the second member along a height axis perpendicular to the base plane.

15. The visual display stand of claim 1, wherein the vertically extending section has a height along a height axis perpendicular to the base plane, and the height is from about 60 mm to about 100 mm.

16. The visual display stand of claim 1, wherein the stand has a width along the second axis that is from about 200 mm to about 300 mm.

17. The visual display stand of claim 1, wherein the second member is located at a mid-point of the first member horizontal base along the first axis.

18. A supported visual display system, comprising:
   a visual display comprising a first side having a screen, a second side opposite the first side, and a bottom having at least one slot; and
   the visual display stand of claim 1, further comprising at least one connector panel extending along a third axis perpendicular to the base plane, wherein the at least one connector panel is vertically insertable into the at least one slot.

19. The supported visual display system of claim 18, wherein the visual display has a length along the first axis, a thickness along the second axis, and a height along the third axis, and the visual display thickness is no more than about ten percent of the visual display length along the first axis and no more than about ten percent of the visual display height along the third axis .

20. The supported visual display system of claim 18, wherein the second member has a cable channel, and the second side of the visual display has a cable channel, and when the visual display stand is in an installed condition on the visual display, the cable channel in the second side of the visual display is aligned with and in communication with the cable channel of the second member, such that a plurality of cables may pass through the second member.

21. An audio-visual system, comprising:
   a visual display system comprising a visual display and the visual display stand of claim 1;
   at least one speaker, wherein the first member is removably attached to the at least one speaker.

22. The audio-visual system of claim 21, wherein the at least one speaker comprises a sound bar having a top and a bottom, and the bottom of the sound bar engages the horizontal base section of the first member.

23. The audio-visual system of claim 22, wherein the bottom of the sound bar comprises a recessed surface that cooperatively engages the first member to removably attach the first member to the sound bar.

24. The audio-visual system of claim 23, wherein when the recessed surface cooperatively engages the first member, and the sound bar bottom is placed on a support surface, the horizontal base section of the first member is concealed from view.

25. A visual display system, comprising:
a visual display; and
a visual display stand member, comprising (i) a horizontal base section defining a base plane having a length along a first axis and a width along a second axis, and (ii) a vertically extending section that extends away from the horizontal base section along the second axis and extends away from the base plane at an angle greater than zero degrees and no more than 90 degrees relative to the base plane, wherein the visual display stand member is attached to the visual display such that the horizontal base plane and the visual display are spaced apart along a third axis perpendicular to the base plane, and along the second axis, wherein the visual display system has a supported configuration and an unsupported configuration, in the supported configuration the display abuttingly engages a vertical support surface, the horizontal base section rests on a horizontal surface, and the visual display is in an upright position, in the unsupported configuration, the visual display does not abuttingly engage the vertical support surface, and the visual display system is incapable of being stably oriented in the upright position, and wherein the vertically extending section has a length and width defining a plane, and the visual display stand does not include a component that applies a force against the vertically extending section with a component of the force that is orthogonal to the plane defined by the length and width of the vertically extending section.

26. The visual display system of claim 25, wherein the base plane length is greater than the base plane width, and the visual display stand member has a thickness that is less than about 10 percent of the base plane width.

27. The visual display system of claim 25, wherein the visual display has a first side comprising a screen and a second side opposite the screen, and the visual display stand member comprises a transition section between the horizontal base section and the vertically extending section, wherein the transition section is concave when facing the first side of the visual display.

28. The visual display system of claim 25, wherein the angle is from about 40 degrees to about 60 degrees.

29. The visual display system of claim 25, wherein the angle is about 90 degrees.

30. The visual display system of claim 26, wherein the thickness is from about 2 mm to about 8 mm.

31. A method of supporting a visual display, comprising:
providing a visual display having a first side comprising a screen and a second side opposite the screen;
connecting a visual display stand member to the visual display, wherein the visual display stand member comprises (i) a horizontal base section defining a base plane having a length along a first axis and a width along a second axis, and (ii) a vertically extending section that extends away from the horizontal base section along the second axis and extends away from the base plane at an angle greater than zero degrees and no more than 90 degrees relative to the base plane; and
positioning the visual display such that the second side of the visual display abuttingly engages a wall, the visual display stand member rests on a support surface, and the vertically extending section is between the base plane and the screen in a direction away from the wall along the second axis, and wherein the vertically extending section has a length along the first axis, a width orthogonal to the first axis, the length and width define a plane, and the visual display stand does not include a component that applies a force against the vertically extending section with a component of the force orthogonal to the plane defined by the length and width of the vertically extending section.

32. The method of claim 31, wherein the base plane length is greater than the base plane width, and the visual display stand member has a thickness that is less than about 10 percent of the width of the base plane.

33. The method of claim 31, wherein the visual display stand member has a first side and a second side, the first side of the visual display stand member is visible when facing the first side of the visual display, and the visual display stand member further comprises a transition section between the horizontal base section and the vertically extending section, wherein the transition section is concave when facing the first side of the member.

34. The method of claim 31, wherein the angle is from about 40 degrees to about 60 degrees.

35. The method of claim 31, wherein the angle is about 90 degrees.

36. The method of claim 32, wherein the thickness is from about 2 mm to about 8 mm.

\* \* \* \* \*